(12) United States Patent
Seki et al.

(10) Patent No.: US 6,710,260 B1
(45) Date of Patent: Mar. 23, 2004

(54) PRINTED CIRCUIT BOARD AND MANUFACTURING METHOD OF THE PRINTED CIRCUIT BOARD

(75) Inventors: Yasuaki Seki, Yokohama (JP); Takashi Ito, Yokohama (JP); Shuji Mochizuki, Tokyo (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 09/537,083

(22) Filed: Mar. 29, 2000

(30) Foreign Application Priority Data

Apr. 1, 1999 (JP) .......................................... 11-095469

(51) Int. Cl.[7] ................................................ H05K 1/00
(52) U.S. Cl. ...................................... 174/258; 174/255
(58) Field of Search ................................. 174/250, 255, 174/256–259

(56) References Cited

U.S. PATENT DOCUMENTS

| | | | |
|---|---|---|---|
| 5,321,211 A | * 6/1994 | Haslam et al. | 174/262 |
| 5,589,250 A | * 12/1996 | Asai et al. | 428/209 |
| 5,741,575 A | * 4/1998 | Asai et al. | 428/209 |
| 6,147,311 A | * 11/2000 | Higashi | 174/261 |
| 6,157,079 A | * 12/2000 | Taguchi | 257/737 |
| 6,217,987 B1 | * 4/2001 | Ono et al. | 174/250 |
| 6,251,502 B1 | * 6/2001 | Yasue et al. | 174/255 |
| 6,281,447 B1 | * 8/2001 | Manning | 174/255 |
| 6,403,221 B1 | * 6/2002 | Nakamura et al. | 427/307 |
| 6,411,519 B2 | * 6/2002 | Asai et al. | 174/255 |

FOREIGN PATENT DOCUMENTS

| | | |
|---|---|---|
| EP | 0 804 061 A1 | 10/1997 |
| JP | 3-8388 | 1/1991 |
| JP | 3-259594 | 11/1991 |
| JP | 5-283843 | 10/1993 |

\* cited by examiner

*Primary Examiner*—David L. Talbott
*Assistant Examiner*—Jeremy Norris
(74) *Attorney, Agent, or Firm*—Connolly Bove Lodge & Hutz LLP

(57) ABSTRACT

In a manufacturing method of a printed circuit board comprising a process of forming a circuit pattern on the surface of the base substrate (13) of which surface is at least composed of an insulative material, a process of forming the insulative layer (15) composed of mixed composites of more than two kinds of organic resins having a different etching rate by a dry etching process on the surface of the base substrate (13) including the circuit pattern, a process of perforating the hole (17) on the insulative layer (15) by a laser beam, a process of roughing the surface of the insulative layer (15) by a dry etching process, a process of forming the conductive film (19) for a foundation of an electroplating process by a vacuum film forming method and a process of forming the conductive layer (20) on the conductive film (19) by an electroplating process so as to connect the conductive layer (20) with the circuit pattern (14) electrically. Accordingly, a printed circuit board having an extremely small anchor profile and a fine pattern can be manufactured in fewer manufacturing processes by utilizing the dry etching process and a spattering film forming process.

1 Claim, 5 Drawing Sheets

PRINTED CIRCUIT BOARD AND MANUFACTURING METHOD OF THE PRINTED CIRCUIT BOARD

BACKGROUND OF THE INVENTION

1. Field of the Invention

The present invention relates to a multi-layer printed circuit board such as a build-up printed circuit board mounted with an electronic component part such as a bare chip, and relates to a manufacturing method of the printed circuit board.

2. Description of the Related Art

Generally, a printed circuit board is utilized for mounting a circuit element such as various kind of electronic component parts in an electronic apparatus. Presently, a printed circuit board is demanded to reduce its dimensions and a circuit pattern is demanded to be finer in accordance with requirements for an electronic apparatus and a circuit element to minimize their dimensions and to integrate them in a high packing density.

Currently, a line width of a circuit pattern and a line pitch between adjoining circuit patterns on a printed circuit board are respectively some 75 µm. However, as a trend in near future, a finer pattern is demanded for mounting a bare chip directly on a printed circuit board or for packaging a bare chip by utilizing a printed circuit board. Accordingly such line width and line pitch are demanded to be smaller than 40 µm.

FIGS. 4(a) through 4(h) show each step of manufacturing method of a printed circuit board in accordance with the prior art.

In FIG. 4(a), a metal film such as a copper foil is formed over a core material 1 as an insulative base substrate composed of glass epoxy resin or like. The copper foil is patterned and formed as a first circuit pattern 2. A line width L1 and a line pitch L2 of the first circuit pattern 2 are some 75 µm minimum and its thickness W1 is some 20 µm. A blacking treatment is applied to a surface of the first circuit pattern 2 so as to increase a degree of contact with an insulative layer composed of epoxy resin, which is formed over the surface of the first circuit pattern 2 in a succeeding process.

In FIG. 4(b), an insulative layer 3 is formed all over the surface of the core material 1 by using such a method as a screen-printing. A main ingredient of the insulative layer 3 is epoxy resin. An appropriate amount of inorganic or organic filler 4 of which particle diameter is approximately 10 µm is mixed in the epoxy resin of the insulative layer 3 and the filler 4 is dissolved during a roughing process, which will be depicted. A thickness of the insulative layer 3 is designed to be 40 to 70 µm.

In FIG. 4(c), a carbon dioxide laser beam 5 irradiates the insulative layer 3 so as to perforate a hole 6 for connection selectively at a predetermined location and to expose the first circuit pattern 2. A residue 7 can remain on the surface of the first circuit pattern 2 while perforating the hole 6 by the carbon dioxide laser beam 5. A diameter of the hole 6 is some 100 µm.

In FIG. 4(d), by applying alkalescent roughing medicinal solution such as potassium permanganate, the surface of the insulative layer 3 is roughed by forming a plurality of pits 8 with dissolving the filler 4, which is solvable by the roughing medicinal solution. Further, the residue 7 remaining in the hole 6 as shown in FIG. 4(c) is cleaned up and removed by an action of the potassium permanganate.

In FIG. 4(e), in order to make a foundation for non-electrolytic plating in a succeeding process, a catalyst 9 is adhered to the surface of the insulative layer 4 and the first circuit pattern 2 by applying a solution dissolving tint and palladium, for example, over the surface of the insulative layer 3 and the first circuit pattern 2 so as to increase conductiveness of the surface of all over the insulative layer 3.

In FIG. 4(f), a first conductive film 10 for electroplating of which main component is copper is formed as a foundation all over the surface of the insulative layer 3 by the non-electrolytic plating, wherein a thickness of the first conductive film 10 is accumulated to approximately 0.3 µm.

In FIG. 4(g), a second conductive film 11 of copper is formed over the first conductive film 10 by the electroplating process, wherein a thickness of the second conductive film 11 is accumulated to approximately 20 µm. Accordingly, the first circuit pattern 2 can be electrically connected to the second conductive film 11. Further, as shown in FIG. 4(h), a second circuit pattern 12 is obtained by etching the second conductive film 11.

In addition thereto, a third circuit pattern is formed after another insulative layer is formed over the second circuit pattern 11 in a regular manufacturing process. Finally a multi-layer printed circuit board can be manufactured by repeating the processes mentioned above.

In the manufacturing method mentioned above, there existed a problem that forming the line width or line pitch of the circuit pattern 12 as fine as smaller than 40 µm is hard to realize. Since the diameter of the filler 4, which is mixed in the insulative layer 3 as a roughing component, is 10 µm, the diameter is so large that a circuit pattern is hard to be formed linearly and accurately in comparison with the line width and line pitch. In addition thereto, a lower part of a conductor, that is, an anchor part becomes larger to the line width in accordance with a progress of an electronic circuit being activated in a higher speed and higher frequency. Accordingly, an RF (radio frequency) characteristic of the electronic circuit is affected by the skin effect.

To solve the problem, it can be feasible to make the diameter of the filler 4 smaller. However, it can not be adopted by reasons that sufficient peeling off strength of a circuit pattern can not be obtained, or the catalyst 9 of non-electrolytic plating will not penetrate into the pit 8 fully or a manufacturing cost increases.

It is also demanded to reduce the diameter of the hole 6 for connection to smaller than 50 µm in accordance with the fining demand mentioned above. If the hole diameter is reduced, however, catalyst of non-electrolytic plating or potassium permanganate hardly penetrates into the hole 6 and plating can not be performed sufficiently. Further, residue remaining in the hole 6 can not be removed fully. Accordingly, an electronic connection between the second conductive film 11 formed by electrolytic plating and the circuit pattern 3 can not be maintained sufficiently.

In addition thereto, the manufacturing method mentioned above is a wet type process of utilizing medicinal solution such as alkalescent potassium permanganate and non-electrolytic plating liquid. Accordingly, further problem occurs such that an additional process of washing off medicinal solution is necessary at each time the medicinal solution is applied and effluent must be processed properly.

SUMMARY OF THE INVENTION

Accordingly, in consideration of the above-mentioned problems of the prior art, an object of the present invention is to provide a printed circuit board and a manufacturing method of the printed circuit board, which can effectively manufacture a printed circuit board having an extremely small anchor profile and a finer pattern in few manufacturing processes by utilizing a dry etching method and a film forming method by spattering.

In order to achieve the above object, the present invention provides, according to an aspect thereof, a printed circuit board comprising a circuit pattern formed on a surface of a base substrate of which surface is at least composed of an insulative material, an insulative layer formed over the surface of the base substrate including the circuit pattern and composed of a mixed insulative material of more than two kinds of organic resins having a different etching rate by a dry etching process, a hole for connection perforated on the insulative layer by a laser beam or like, a conductive film for electroplating process as a foundation of electroplating formed on the surface of the insulative layer by a vacuum film forming process after roughing the surface of the insulative layer by removing a part of the surface of the insulative layer with a dry etching process and a conductive layer formed over the conductive film by an electroplating process, wherein the conductive layer is connected with the circuit pattern electrically.

According to another aspect of the present invention, there provided a manufacturing method of a printed circuit board comprising steps of forming a circuit pattern on a surface of a base substrate of which surface is at least composed of an insulative material, forming an insulative layer over the surface of the base substrate including the circuit pattern and the insulative layer composed of a mixed insulative material of more than two kinds of organic resins having a different etching rate by a dry etching process, perforating a hole for connection on the insulative layer by a laser beam or like, roughing the surface of the insulative layer by removing a part of the surface of the insulative layer with a dry etching process, forming a conductive film for electroplating process as a foundation of electroplating on the surface of the insulative layer by a vacuum film forming process and forming a conductive layer over the conductive film by an electroplating process, wherein the conductive layer is connected with the circuit pattern electrically.

Other object and further features of the present invention will be apparent from the following detailed description when read in conjunction with the accompanying drawings.

DETAILED DESCRIPTION OF THE PREFERRED EMBODIMENTS

First Embodiment

Figure 1A:
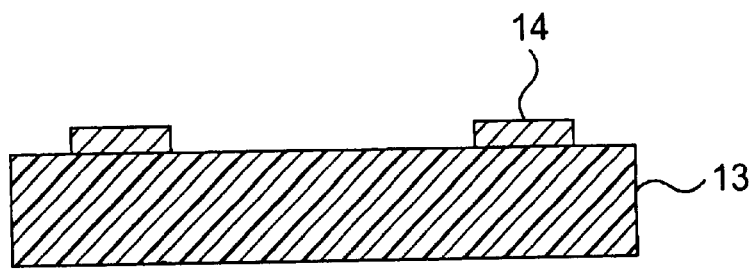
FIGS. 1(a) through 1(g) show each step of manufacturing a printed circuit board according to an embodiment of the present invention.

According to an aspect of the present invention, there provided a printed circuit board, which is excellent in a radio frequency (RF) characteristic because of having a finer and thinner circuit pattern than a current printed circuit board. The printed circuit board comprises a base substrate, a first circuit pattern, an insulative layer, a hole for connection, a conductive film for electroplating and a conductive layer for a second circuit pattern. The first circuit pattern is formed on a surface of the base substrate of which the surface is at least made from an insulative material. The insulative layer, which is made from an insulative material composed of more than two organic resins having a different etching rate for a dry etching process from each other, is formed over the base substrate including the first circuit pattern.

The hole for connection is perforated on the insulative layer by means of laser beam or like. The surface of the insulative layer is roughed by removing a part of it with a dry etching process. The conductive film for electroplating is formed over the surface of the insulative layer, which is dry etched, so as to be a foundation for the electroplating. The conductive layer is formed by the electroplating process over the conductive film for electroplating. The conductive layer is connected electrically with the first circuit pattern. The second circuit pattern is formed by etching the conductive layer. Accordingly, the printed circuit board in accordance with a first embodiment of the present invention is provided.

According to the first embodiment of the present invention, a printed circuit board, which has profiles of a finer line width, a finer line pitch and a finer roughing process, can be provided in a fewer manufacturing processes than the current manufacturing process without increasing a number of processing steps.

The insulative layer mentioned above is composed of mixed compositions of more than two organic resins having a different dry etching rate from each other and processed through an ion bombard method with inert gas such as Ar (argon), which is applied to the compositions. Accordingly, the insulative layer can be formed with extremely fine and uniform rugged surface in a unit of molecular cluster and an anchor profile of less than 2 $\mu$m can be obtained. The fine and uniform rugged surface can maintain flatness at an interface of resins, which affect linearity and an RF characteristic, for a finer pattern than smaller than 40 $\mu$m, for example. Further, by using such a resin excluding filler, which roughens a surface of the insulative layer too much, a thinner insulative layer can sustain sufficient insulation characteristics. Furthermore, such the insulative layer can make a contribution to thinning a printed circuit board and to lightening its weight.

There exist a relationship between the anchor profile and a contact strength. The larger the anchor profile is, the stronger the contact strength becomes. This is basically caused by affinity between the resin insulative layer and the conductive film for electroplating. However, when an anchor is formed, it is also caused by that a boundary area between the resin insulative layer and the conductive film increases and that projections and pits formed on the rugged surfaces of them are not simply tapered but reversely tapered in some area. Accordingly, the projections and pits, which engage each other, can hardly slip out. An upper limit of a degree of face roughness is approximately 2 $\mu$m in order to form a pattern as mentioned above. If a degree of face roughness is less than 0.1 $\mu$m, a sufficient contact strength can no be obtained. Thus, a degree of face roughness of an insulative layer is desirable within a range of from 0.1 to 2 $\mu$m.

If the conductive film for electroplating mentioned above is formed by a vacuum film forming method such as sputtering, ion plating and evaporating on the fine rugged surface formed by the dry etching process, the conductive film having a enough contact strength can be formed. As for a material of the conductive film, Ni (nickel) and Fe (iron) and their alloy with copper are best because they have affinity with resin and can be easily etched by etching solution for copper. With respect to a temperature for forming film, it is more effective to heat while forming a film, although a contact strength can be obtained sufficiently in the normal temperature. Further, a contact strength can be improved and a total time duration of manufacturing a printed circuit board can be reduced by applying sequentially a dry etching and a vacuum film forming method with keeping a non-destructive vacuum environment.

Currently, a carbon dioxide laser beam is commonly utilized for perforating the hole for connection. However, processing an area of less than 50 $\mu$m is hardly feasible because a wave length of the laser beam is approximately 10 $\mu$m, which is rather long, so that a spot of the laser beam can hardly be focused. Since residue of resin remains in approximately 1 $\mu$m thick after the laser processing, the residue must be removed by such a method as de-smearing. According to the present invention, a YAG (yttrium aluminum garnet) laser having a wave length of 400 to 600 nm is utilized for perforating the hole for connection, so that resin residue can be eliminated in conjunction with focusing a laser spot in an extremely small diameter. In the case of the carbon dioxide laser beam, an absorption ratio of copper to a laser beam is less than 10%, so that most of the laser beam is reflected on the surface of the insulative layer and not abrade into the insulative layer. Accordingly, the laser beam generates heat and melts surrounding resin, so that the melted resin remains in film. On the other hand, in the case of the YAG laser beam having the wave length of 400 to 600 nm, an absorption ratio of copper to the YAG laser beam is from 20 to 55%, copper is abraded properly, so that the resin residue does not remain. Accordingly, the process of de-smearing is not necessary. If a wave length of a laser beam is smaller than 400 nm, an absorption ratio of copper increases and the circuit pattern may be perforated as deep as some $\mu$m due to excess abrasion. Therefore, in a case where a thickness of copper becomes thinner in accordance with being a circuit pattern made finer in the near future, a laser processing by using the wave length of less than 400 nm is harmful for copper of a circuit pattern because the copper is shaved too thin.

Second Embodiment

FIGS. 1(a) through 1(g) show each step of manufacturing a printed circuit board according to an embodiment of the present invention.

According to another aspect of the present invention, there provided a manufacturing method of a printed circuit board, which is characterized by that an electroplating process is only adopted as a wet processing and other processes are a dry etching and a vacuum film forming processes.

As shown in FIG. 1(a), a first circuit pattern 14 is formed by patterning copper foil or like built up over a surface of an insulative core material 13, which is composed of grass epoxy resin as a base substrate. In order to increase a degree of contact with an epoxy resin layer in a succeeding process, a surface of the first circuit pattern 14 is oxidized and applied with a blacking treatment.

Figure 1B:
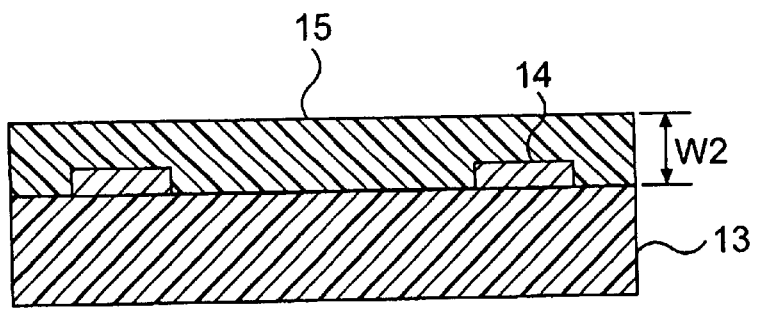

In FIG. 1(b), an insulative layer 15 is formed all over the core material 13 including the first circuit pattern 14 by a coating process such as a screen printing. The insulative layer 15 comprises insulative materials of mixed composites, which are more than two kinds of organic resins having a different dry etching rate from each other. Major material of the insulative layer 15 is a mixed composites of an epoxy resin, for example, and a polyimide resin of which dry etching rate is relatively higher than that of the epoxy resin. Filler as a roughing composition mentioned above is not included in the insulative layer 15. A thickness W2 of the insulative layer 15 is designed to from 20 to 30 $\mu$m. The thickness is more thinner than that of a current printed circuit board, that is, 40 to 70 $\mu$m.

Figure 1C:
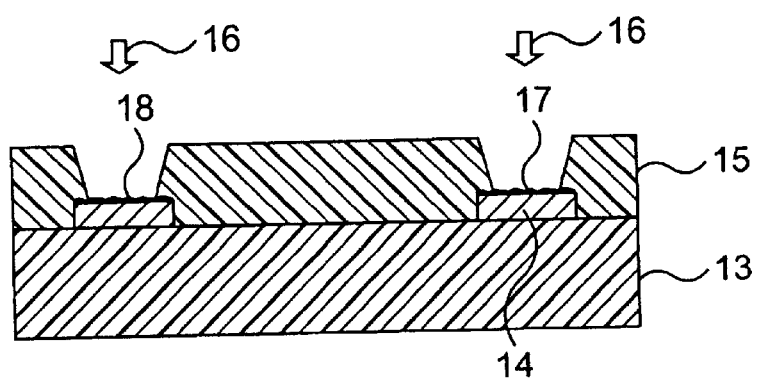

In FIG. 1(c), a hole 17 for connection is selectively perforated through the insulative layer 15 by irradiating a YAG laser beam 16 of a wave length of 400 to 600 nm so as to expose the internal first circuit pattern 14. A diameter of the hole 17 is 20 to 50 $\mu$m and is further smaller than that of a current printed circuit board. A residue 18 may remain, if a carbon dioxide laser beam is utilized for perforating the hole 17 as mentioned above.

Figure 1D:
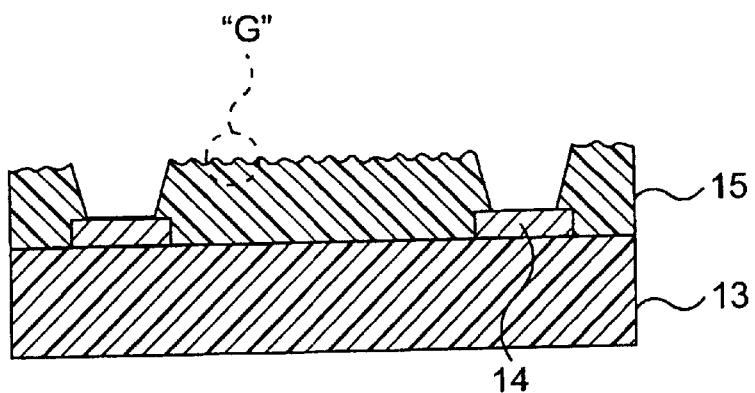

As shown in FIG. 1(d), the total core material including the first circuit pattern 14 and the insulative layer 15 shown in FIG. 1(c) is applied with a dry etching process in a dry etching apparatus. Further details of the dry etching process are depicted with referring FIGS. 2 and 3.

Figure 2:
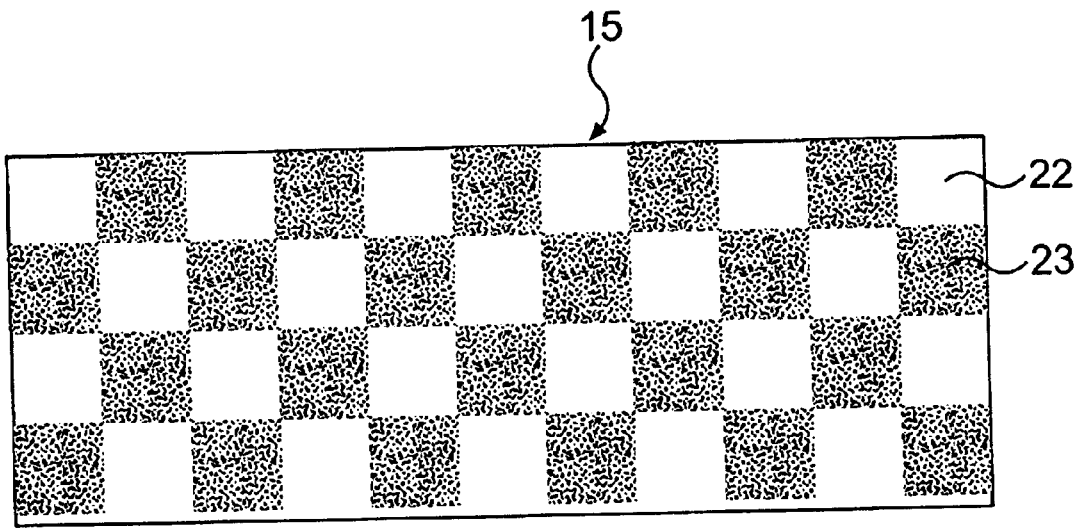
FIG. 2 shows an enlarged plan view of a part "G" shown in FIG. 1(d).

FIG. 2 shows an enlarged plan view of a part "G" shown in FIG. 1(d).

Figure 3:
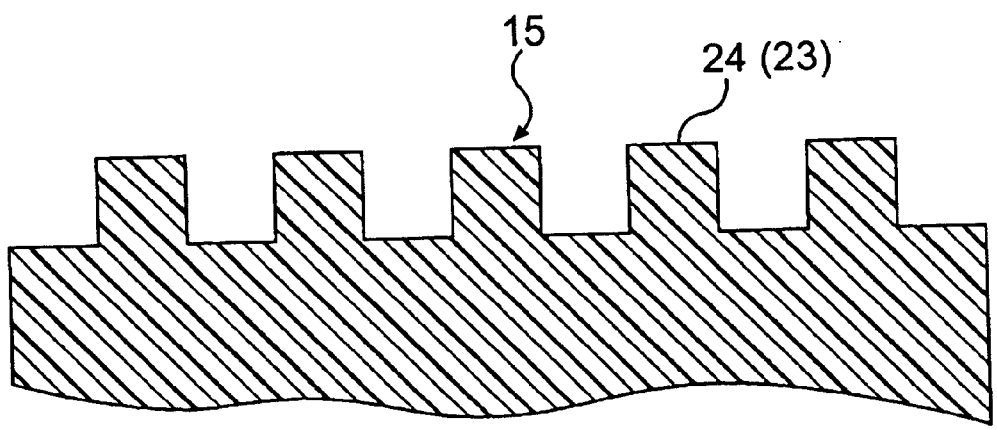
FIG. 3 shows an enlarged sectional view of the part "G" shown in FIG. 1(d).
Figure 4A:
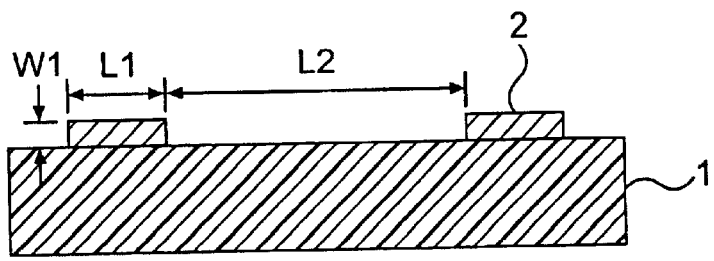
FIGS. 4(a) through 4(h) show each step of manufacturing a printed circuit board according to the manufacturing method of the prior art.
Figure 4B:
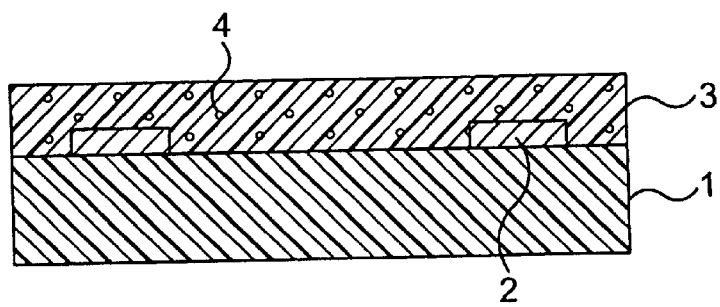
Figure 4C:
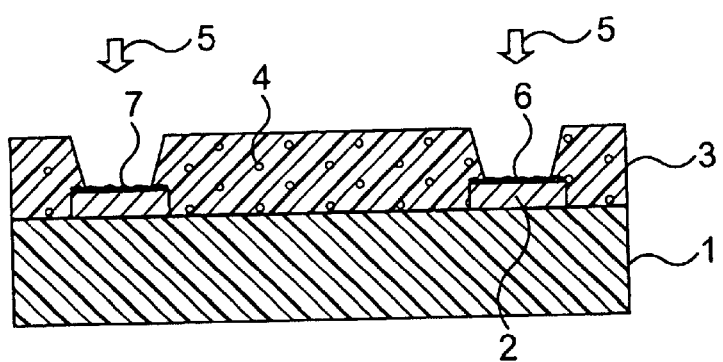
Figure 4D:
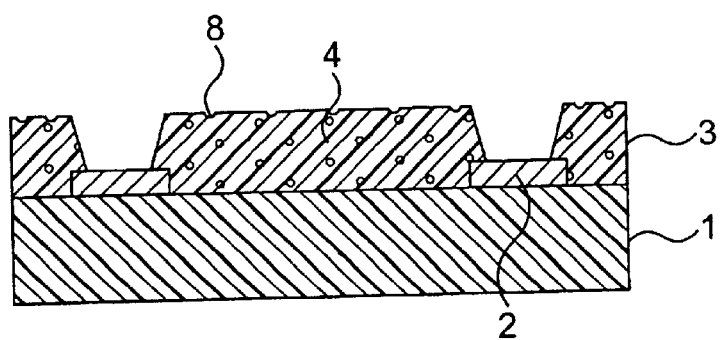
Figure 4E:
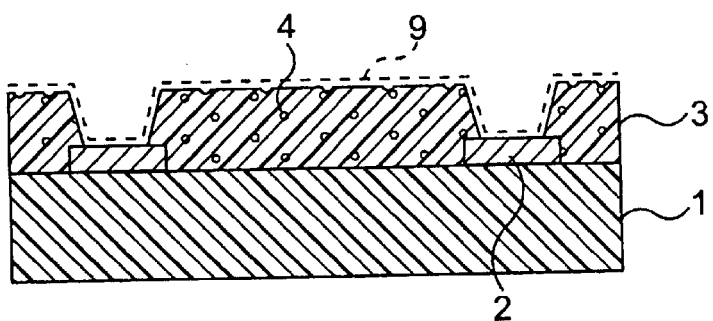
Figure 4F:
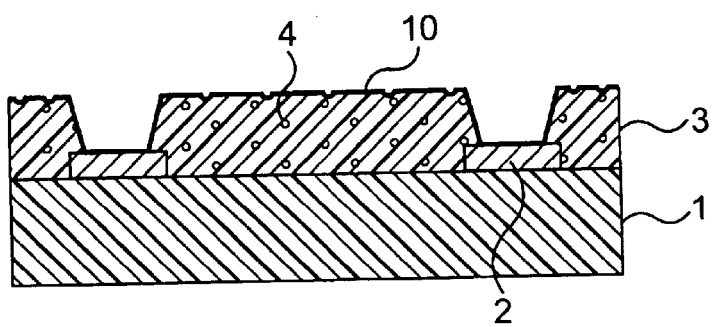
Figure 4G:
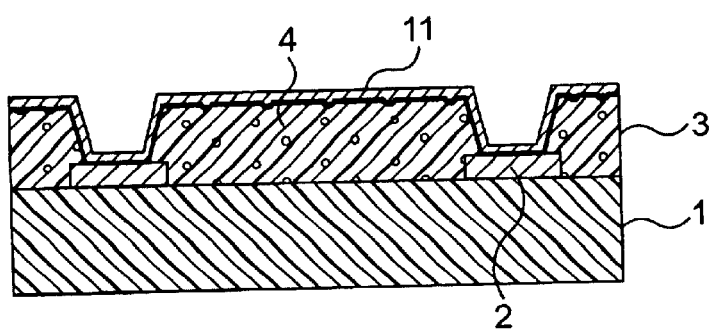
Figure 4H:
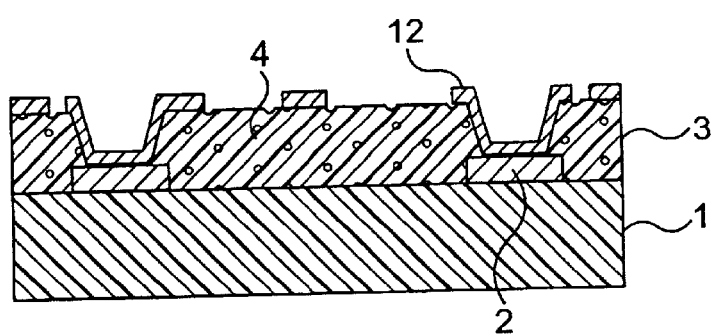

FIG. 3 shows an enlarged sectional view of the part "G" shown in FIG. 1(d).

As shown in FIG. 2, the insulative layer 15 is mixed composites of a first resin 22 having a higher dry etching rate and a second resin 23 having a lower dry etching rate than that of the first resin 22. A surface of the first resin 22 is slightly shaved by the dry etching process and removed selectively. In this case, as shown in FIG. 3, the second resin 23 having the lower dry etching rate remains with forming a projection 24 because the first resin 23 is hardly removed by the dry etching process. A uniform rugged surface appears on the surface of the insulative layer 15. Accordingly, the surface of the insulative layer 15 is roughed uniformly.

A regular reactive ion etching (RIE) apparatus or an ashing device such as a chemical dry etching (CDE) apparatus can be utilized as an etching apparatus. For dry etching, inert gas such as Ar is utilized as etching gas. A partial pressure of the gas is 0.03 to 1.0 Torr although it varies by resin to be etched.

Referring back to FIG. 1(c), the residue 18 may slightly remain in the hole 17 in a depth of approximately 10 nm while perforating the hole 17 by a carbon dioxide laser beam. However, the residue 18 is removed during the dry etching process, in other words, by a reverse spattering phenomenon.

Figure 1E:
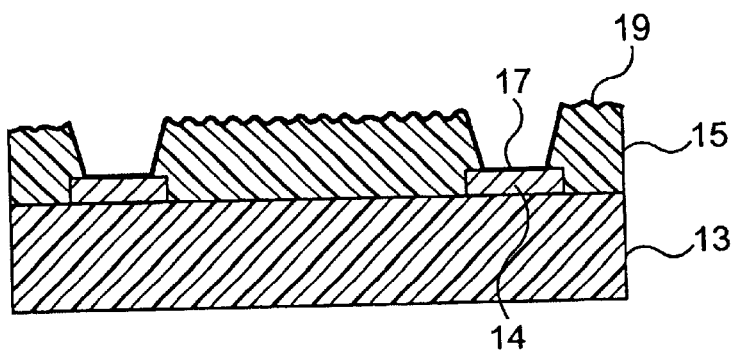

As shown in FIG. 1(e), the total core material is applied with a spattering film forming process in a spattering apparatus, which applies a vacuum film forming process. A conductive film 19 for electroplating is formed all over the insulative layer 15 and an inner wall of the hole 17 until the thickness of the conductive film becomes approximately 0.3 $\mu$m, for example. An alloy composed of 90% of Ni and 10% of Cu, for example, is utilized for a material of the conductive film 19. A direct current (DC) magnetron spattering apparatus, for example, can be utilized for a spattering apparatus. An Ar gas can be utilized for a plasma gas.

Figure 1F:
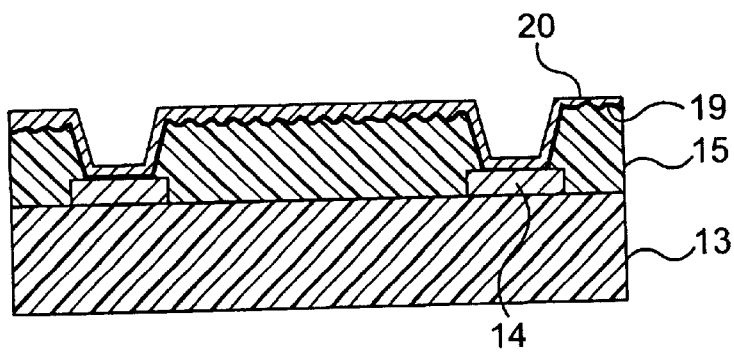

In FIG. 1(f), a conductive layer 20 composed of copper is formed in approximately 20 $\mu$m thick, for example, on the conductive film 19 for electroplating by an electroplating process. Accordingly, the conductive layer 20 can be electrically connected to the first circuit pattern 14 in a lower layer of the printed circuit board.

Figure 1G:
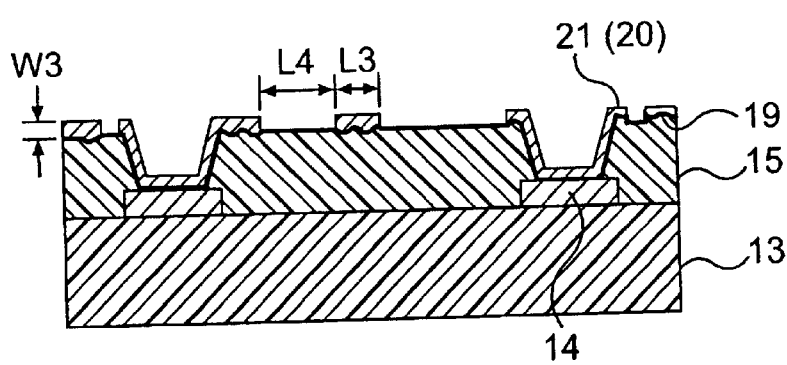

Further, as shown in FIG. 1(g), a second circuit pattern 21 is formed by etching the conductive layer 20. A line width L3 and a line pitch L4 of the second circuit pattern 21 are 20 to 40 μm respectively. They are much finer than those of a current printed circuit board are. A depth W3 of the second circuit pattern 21 is 5 to 15 μm.

As a regular process, a surface of the second circuit pattern 21 is oxidized and applied with a blacking treatment so as to increase a degree of contact with an epoxy resin layer, which is built up on the surface of the second circuit pattern 21 in a succeeding process, and then another insulative layer is formed all over the second circuit pattern 21. This printed circuit board having another insulative layer is treated as a base substrate and applied with patterning of a circuit pattern once again, and then a multi-layer printed circuit board, that is, a build-up printed circuit board is manufactured by repeating the above mentioned processes.

According to the aspect of the present invention, since the roughing process of a resin surface of an insulative layer and the forming process of a conductive film for electroplating by an non-electrolytic plating method are processed in a dry condition without utilizing liquid although a wet process is applied for a current method, many washing processes and neutralizing processes, which are necessary for the current method by a wet process, can be eliminated.

While the invention has been described above with reference to specific embodiments thereof, it is apparent that many changes, modifications and variations in the arrangement of equipment and devices and in materials can be made without departing from the invention concept disclosed herein. For example, pure Ni, pure Fe, an alloy of Ni and Cu or an alloy of Fe and Cu can also be utilized for the conductive film 19 for electroplating instead of the alloy composing of 90% of Ni and 10% of Cu. An apparatus for forming the conductive film 19 is not limited to the spattering apparatus. Any kind of vacuum film forming methods can also be utilized for forming the conductive film 19.

Further, the line width L3 and the line pitch L4 of the second circuit pattern 21, the thickness W2 of the insulative layer 15 and the diameter of the hole 17 are not limited to the values mentioned above. Any dimensions are acceptable.

Furthermore, an anchor profile, which assures a degree of contact between a conductive layer and a resin or an insulative layer, can be designated as small as 0.1 to 2.0 μm. Accordingly, a fine pattern having a line width and a line pitch of 10 to 40 μm can be formed and the fine pattern improves an RF characteristic in conjunction with fining an anchor. In addition thereto, a number of resins utilized for the insulative layer 15 is not limited to two. Any number of resins can be utilized as well.

According to the aspect of the present invention, there provided a printed circuit board and a manufacturing method of the printed circuit board, which exhibits following effects.

Since a surface of an insulative layer composed of mixed composites of more than two kinds of organic resins having different etching rate by a dry etching process is roughed and a conductive film is formed over the surface of the insulative layer by a vacuum film forming method, a printed circuit board having a fine circuit pattern can be manufactured without increasing a number of manufacturing processes or with decreasing a number of manufacturing processes. Accordingly, a printed circuit board, which is low in price, thin in thickness, excellent in an RF characteristic and has a fine pattern, can be provided.

What is claimed is:

1. A printed circuit board comprising:
   a circuit pattern formed on a surface of a base substrate, the surface at least comprising an insulative material;
   an insulative layer formed over the surface of said base substrate and including said circuit pattern, the insulative layer comprising a mixed insulative material of more than two kinds of organic resins having different etching rates during a dry etching process;
   a connection hole perforating said insulative layer;
   a conductive film forming an electroplating foundation, electroplating formed on the surface of said insulative layer by a vacuum film forming process after roughing the surface of said insulative layer by removing a part of the surface of said insulative layer with a dry etching process; and
   a conductive layer formed over said conductive film by an electroplating process;
   wherein said conductive layer is connected with said circuit pattern electrically.

* * * * *